United States Patent
Kramer et al.

(10) Patent No.: US 7,133,483 B1
(45) Date of Patent: Nov. 7, 2006

(54) APPARATUS AND METHOD FOR A JITTER CANCELLATION CIRCUIT

(75) Inventors: Paul Joseph Kramer, Fort Collins, CO (US); Jered Michael Sandner, Wellington, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 719 days.

(21) Appl. No.: 10/255,166

(22) Filed: Sep. 24, 2002

(51) Int. Cl.
*H04L 25/00* (2006.01)
*H04L 25/40* (2006.01)
*H04L 7/00* (2006.01)

(52) U.S. Cl. .................. 375/371; 375/354; 370/516

(58) Field of Classification Search ............ 375/371, 375/354; 370/516
See application file for complete search history.

(56) References Cited

U.S. PATENT DOCUMENTS 5,309,428 A * 5/1994 Copley et al. ............. 370/245
5,859,634 A * 1/1999 Ou et al. .................. 345/213

* cited by examiner

*Primary Examiner*—Jean B. Corrielus
*Assistant Examiner*—Erin M. File
(74) *Attorney, Agent, or Firm*—Brett A. Hertzberg; Merchant & Gould PC

(57) ABSTRACT

The invention produces an output signal that maintains a substantially constant period corresponding to a clock signal. An input signal includes a period that is an integer multiple of the period of the clock signal. The timing or phase of the input signal may shift in comparison to the clock signal resulting in jitter. The invention detects and cancels the jitter by varying a delay between the input signal and the output signal. The delay corresponds to an integer multiple of the period of the clock signal such that a substantially constant period is maintained for the output signal. Alternatively, the intended period for the output signal may be adjusted to match a new period when a determination is made that a sufficient difference exists between the new period of the input signal and the intended period.

19 Claims, 4 Drawing Sheets

| EVAL | DIFF | diff | SIGNst | NXTCOUNTst | NXTSIGNst |
|---|---|---|---|---|---|
| 0 | XXX | X | X | COUNTst | SIGNst |
| 1 | 000 | 0 | X | COUNTst | SIGNst |
| 1 | 001 | +1 | 0 | COUNTst | 1 |
| 1 | 001 | +1 | 1 | COUNTst + 1 | 0 |
| 1 | 111 | −1 | 0 | COUNTst − 1 | 1 |
| 1 | 111 | −1 | 1 | COUNTst | 0 |
| 1 | 010 | +2 | X | COUNTst + 1 | 1 |
| 1 | 110 | −2 | X | COUNTst − 1 | 0 |
| 1 | 011 | +3 | X | COUNTst + diff | 1 |
| 1 | 100 | ±4 | X | COUNTst + diff | 1 |
| 1 | 101 | −3 | X | COUNTst + diff | 1 |

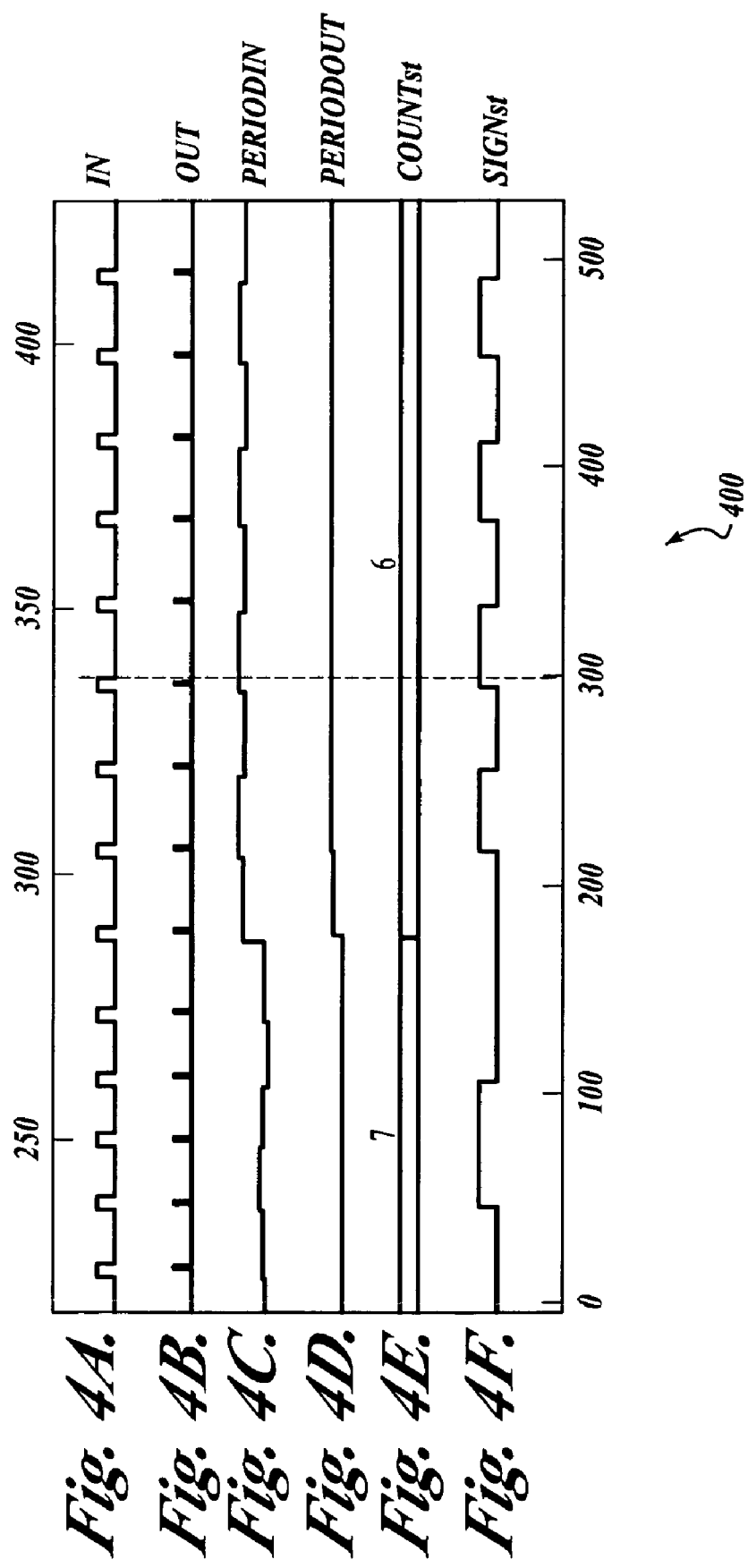

APPARATUS AND METHOD FOR A JITTER CANCELLATION CIRCUIT

FIELD OF THE INVENTION

The present invention relates to periodic signals and, more particularly, to canceling jitter in a periodic signal using a jitter cancellation circuit.

BACKGROUND INFORMATION

Often, clock signals having various periods are produced from a master clock signal. The master clock signal may be generated by a phase-locked loop circuit or other clock generation circuit. Additional timing signals may then be generated from the master clock signal.

In one example, clock signals having different periods provide a variety of signals for producing an image on a screen. These signals are often phase-aligned with one another to ensure the integrity of the image on the screen. Current examples of these signals include a pixel clock, a horizontal synch signal, a vertical synch signal, as well as others. In certain cases, the master clock signal and the pixel clock signal are the same signal.

In some applications, there may be noise or non-ideal components in a display generation circuit that cause fluctuations in the frequency of one or more of the signals. For example, a horizontal synch signal may be sampled according to the pixel clock to synchronize the horizontal synch signal with the pixel clock. If the horizontal synch signal is sampled at or near its transitions, fluctuations in the frequency may cause the sample to be taken before or after the transition of the horizontal synch signal. Additionally, the sampling clock may be imperfect, also affecting the sampling. Slight variations of the period of an input clock signal may also affect a resulting output clock signal. These imperfections, non-ideal properties, and variations may result in jitter of the display. The jitter may be as severe as to significantly reduce the clarity of the displayed image.

SUMMARY

In accordance with the invention, an apparatus for canceling jitter from an input signal to produce an output signal with a substantially constant period includes a pipe delay selector and a state machine. The pipe delay selector is arranged to produce the output signal. The period of the output signal is determined by the period of the input signal. The state machine is arranged to produce the select signal. The select signal enables the pipe delay selector to adjust a pipe delay according to a predetermined number of cycles of the clock signal such that the output signal maintains a substantially constant period.

In accordance with another aspect of the present invention, the apparatus includes a synchronizer circuit that is arranged to produce a synchronized signal. The synchronized signal corresponds to the input signal, and has a known timing relationship with the clock signal.

In accordance with yet another aspect of the present invention, the apparatus includes one-shot circuit that is coupled to the synchronizer circuit. The one-shot circuit is arranged to produce a pulse signal according to a rising edge of the input signal.

In accordance with still another aspect of the present invention, the apparatus includes a counter circuit that is arranged to produce a modulus signal. The modulus signal has a value that is related to the period of the input signal.

A subtract circuit is arranged to determine the difference between the modulus signal and another signal corresponding to an expected period for the input signal.

In accordance with a further aspect of the present invention, an intended period for the output signal is adjusted to match a new period associated with the input signal. The intended period is adjusted when a determination is made that a sufficient difference exists between the new period of the input signal and the intended period. Alternatively, the intended period for the output signal is adjusted towards the new period for certain differences.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

BRIEF DESCRIPTION OF THE DRAWINGS

FIG. 3 illustrates a table describing an exemplary logical operation of the state logic circuit shown in FIG. 2; and FIGS. 4A–4F show a timing diagrams of signals associated with the jitter cancellation circuit of FIG. 2, in accordance with the present invention.

DETAILED DESCRIPTION

Figure 1:
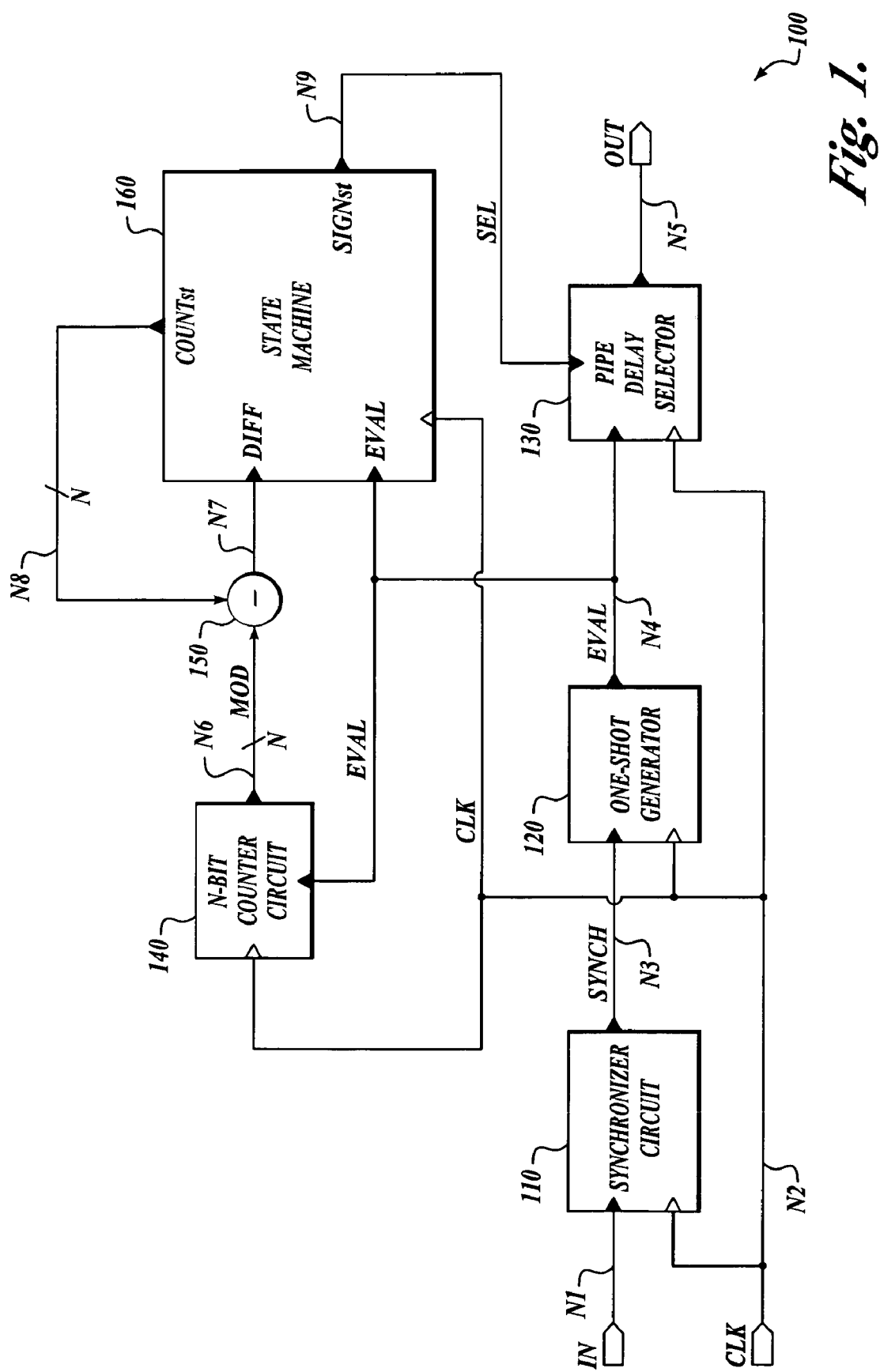
FIG. 1 illustrates a schematic diagram of a jitter cancellation circuit.

In the following detailed description of exemplary embodiments of the invention, reference is made to the accompanied drawings, which form a part hereof, and which is shown by way of illustration, specific exemplary embodiments according to which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention generally enables jitter of an input signal to be cancelled, producing an output signal having a substantially constant period. In one embodiment, the jitter cancellation circuit includes a synchronizer circuit, one-shot generator, pipe delay selector, N-bit counter circuit, and state machine. Jitter on the input signal is cancelled by varying a delay between the input signal and the output signal to offset the effect of the jitter. The jitter cancellation circuit effectively determines the "expected" period for the output signal, and attempts to maintain that period on the output signal. If a cycle of the input signal has new period that is sufficiently different from the expected period however, the jitter cancellation circuit does not attempt to offset the difference. Instead, the jitter cancellation circuit adjusts the expected period to match the new period.

In one example, the period of the input signal may be greater than or less than an intended period for the output signal. A delay of a predetermined number of cycles of the clock signal may be added to or removed between the input signal and an output signal, such that the output signal maintains a substantially constant period. Alternatively, when a determination is made that a sufficient difference exists between a new period of the input signal and the intended period, the intended period may be adjusted to match the new period.

Initially, the input signal is synchronized such that a synchronized signal is produced that has a known timing relationship (phase-delay) with the clock signal. The synchronized signal is used to produce a pulse signal. The period of the pulse signal is an integer multiple (e.g., "M") of the period of the clock signal. However, the integer multiple may vary from cycle to cycle of the input signal. An expected period is measured for the output signal. A select signal is produced to select a delay to cancel the variance between the pulse signal and the output signal. Canceling the jitter produces an output signal with a substantially constant period maintained at the expected period. However, when a new period of the input signal differs from the previous period by a sufficient number of cycles of the clock signal, the expected period is adjusted to match the new period.

FIG. 1 illustrates an overview schematic of jitter cancellation circuit 100 that includes synchronizer circuit 110, one-shot generator 120, pipe delay selector 130, N-bit counter circuit 140, subtractor circuit 150, and state machine 160.

Synchronizer circuit 110 includes a first input that is coupled to node N1, a second input that is coupled to node N2, and an output that is coupled to node N3. One-shot generator 120 includes a first input that is coupled to node N2, a second input that is coupled to node N3, and an output that is coupled to node N4. Pipe delay selector 130 includes a first input that is coupled to node N2, a second input that is coupled to node N4, a third input that is coupled to node N9, and an output that coupled to node N5. N-bit counter circuit 140 includes a first input that is coupled to node N2, a second input that is coupled to node N4, and an output that is coupled to node N6. Subtractor circuit 150 includes a first input that is coupled to node N6, a second input that is coupled to node N8, and an output that is coupled to node N7. State machine 160, includes a first input that is coupled to node N2, a second input that is coupled to node N4, a third input that is coupled to node N7, a first output that is coupled to node N8, and a second output that is coupled to node N9.

In operation, an input signal (IN) and a clock signal, reference signal, (CLK) are received at nodes N1 and N2 respectively. Synchronizer circuit 110 is arranged to produce a synchronized signal (SYNCH). The synchronized signal (SYNCH) is produced in response to the input signal (IN) when activated by the clock signal (CLK). The synchronized signal (SYNCH) has a known timing relationship (phase delay) with the clock signal (CLK).

One-shot generator 120 is arranged to produce pulse signal (EVAL). The pulse signal (EVAL) is produced in response to the synchronized signal (SYNCH) when activated by the clock signal (CLK). The pulse signal (EVAL) includes a pulse having a width of one cycle of the clock signal (CLK). A pulse occurs on the pulse signal (EVAL) for each rising edge of the input signal (IN). The period of the pulse signal (EVAL), or pulse period, corresponds to a number (e.g., "M") of cycles of the clock signal (i.e., clock cycles).

Pipe delay selector 130 produces the output signal (OUT) by removing or adding a delay after the pulse signal (EVAL). The delay is selected in response to the select signal (SEL) when activated by the clock signal (CLK). The delay corresponds to the difference between a current pulse period and an expected pulse period. The difference is measured as an integer number of clock cycles. Accordingly, the selected delay is an integer number of clock cycles. Stated differently, a delay of one or more clock cycles may be added or removed between the pulse signal (EVAL) and the output signal (OUT). Since the delay offsets the difference between pulse periods, a substantially constant period is maintained for the output signal (OUT) despite variances from one period of the pulse signal (EVAL) to the next.

N-bit counter circuit 140, Subtractor circuit 150, and state machine 160 are arranged to produce the select signal (SEL). N-bit counter circuit 140 is reset by the pulse signal (EVAL). N-bit counter circuit 140 is a free-running counter that continuously counts to an integer corresponding to the "N" bits unless reset by the pulse signal (EVAL). Accordingly, N-bit counter circuit 140 measures a "period modulus" of the synchronized signal (SYNCH). For pulse periods that do not vary greater than $2^N$, the period modulus is different for pulse periods of different lengths. For example, if the modulus number is five, a pulse period may have a period modulus of 0, 1, 2, 3, 4, or 5. In this example, a pulse period with a period modulus of 4 is one clock cycle greater than a previous pulse period with a period modulus of 3. However, a difference greater than five clock cycles may occur between pulse periods. In such a case, as long as period of the pulse signal (EVAL) does not continually vary by five or more, eventually the difference is accurately measurable at later periods. The period modulus is represented according to an N-bit modulus signal (MOD) at the output of N-bit counter circuit 140.

Subtractor circuit 150 is arranged to measure the difference between the N-bit modulus signal (MOD) and an N-bit count state signal (COUNTst) produced by state machine 160. Subtractor circuit 150 produces an N-bit difference signal (DIFF) according the measured difference between the N-bit modulus signal (MOD) and the N-bit count state signal (COUNTst).

State Machine 160 uses the N-bit difference signal (DIFF) to produce the select signal (SEL). The select signal (SEL) corresponds to logic within state machine 160 that determines whether a delay may be added or removed between the pulse signal (EVAL) and the output signal (OUT), or whether the expected period for the output signal (OUT) should be adjusted. The operation of the logic within state machine 160 is described in greater detail in the discussion of FIGS. 2 and 3 below.

In one embodiment, synchronizer circuit 110 may be removed when the input signal (IN) and clock signal (CLK) have a synchronous relationship prior to their input into jitter cancellation circuit 100. In another embodiment, one-shot generator 120 may be removed from the signal path between the input signal (IN) and the output signal (OUT). Without one-shot generator 120, the width of the pulses for output signal (OUT) and pulse signal (EVAL) substantial match the pulse width of the input signal (IN). However, one-shot generator 120 is still used to provide a pulse signal to the N-bit counter 140 and state machine 160.

Figure 2:
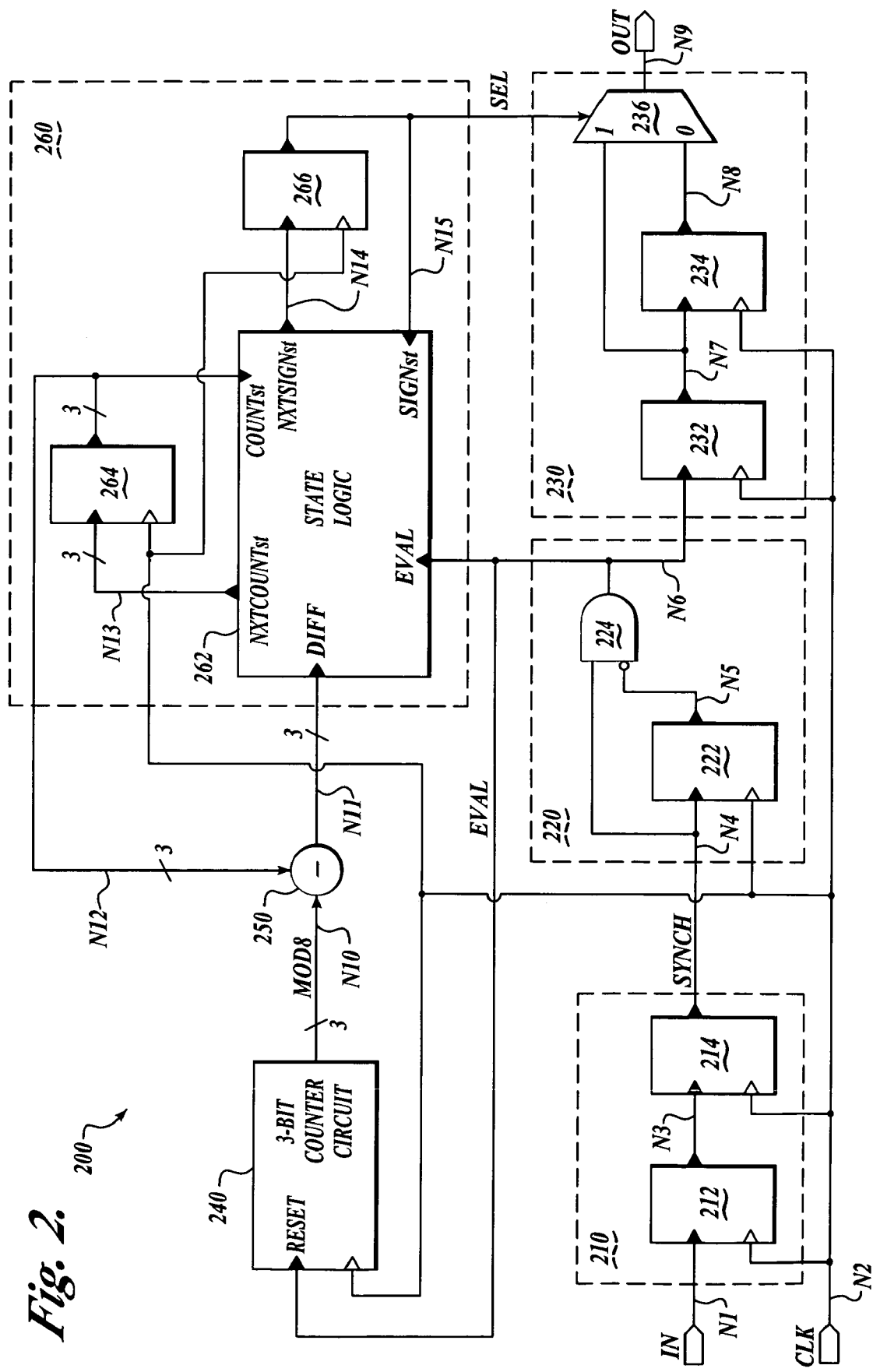
FIG. 2 shows a schematic diagram of exemplary discrete elements included in the jitter cancellation circuit.

FIG. 2 shows a schematic diagram 200 of exemplary individual elements that are employed in jitter cancellation circuit 100 illustrated in FIG. 1. The schematic diagram (200) includes synchronizer circuit 210, one-shot generator 220, pipe delay selector 230, 3-bit counter circuit 240, and subtractor circuit 250, and state machine 260.

Synchronizer circuit 210 includes two flip-flop circuits 212 and 214. Flip-flop circuit 212 includes a first input that is coupled to node N1, a second input that is coupled to node N2, and an output that is coupled to node N3. Flip-flop circuit 214 includes a first input that is coupled to node N2, a second input that is coupled to node N3, and an output that is coupled to node N4.

One-shot circuit 220 includes flip-flop circuit 222 and logic gate 224. Flip-flop circuit 222 includes a first input that is coupled to node N2, a second input that is coupled to node N4, and an output that is coupled to node N5. Logic gate 224 includes a first input that is coupled to node N4, a second input that is inversely coupled to node N5, and an output that is coupled to node N6.

Pipe delay selector 230 includes two flip-flop circuits 232 and 234, and multiplexer circuit 236. Flip-flop circuit 232 includes a first input that is coupled to node N2, a second input that is coupled to node N6, and an output that is coupled to node N7. Flip-flop circuit 234 includes a first input that is coupled to node N2, a second input that is coupled to node N7, and an output that is coupled to node N8. Multiplexer circuit 236 includes a first input that is coupled to node N7, a second input that is coupled to node N8, a third input that is coupled to node N15, and an output that is coupled to node N9.

3-bit counter circuit 240 includes a first input that is coupled to node N2, a second input that is coupled to node N6, and a 3-bit output that is coupled to node N10.

Subtractor circuit 150 includes a first input that is coupled to node N10, a second input that is coupled to node N12, and an output that is coupled to node N11.

State machine 260 includes state logic circuit 262, a parallel flip-flop circuit 264 and a flip-flop circuit 266. State logic circuit 262 includes a first input that is coupled to node N6, a second input that is coupled to node N11, a third input that is coupled to node N12, a fourth input that is coupled to node N15, a first output that is coupled to node N13, and a second output that is coupled to node N14. Parallel flip-flop circuit 264 includes a first input that is coupled to node N2, a second input that is coupled to node N13, and an output that is coupled to node N12. Flip-flop circuit 264 represents three flip-flop circuits in parallel for each bit of the 3-bit signal at node N13. Flip-flop circuit 266 includes a first input that is coupled to node N2, a second input that is coupled to node N14, and an output that is coupled to node N15.

Similar to FIG. 1, an input signal (IN) and a clock signal (CLK) are received at nodes N1 and N2 respectively. Flip-flop circuits 212 and 214 of synchronizer circuit 210 are arranged to produce a synchronized signal (SYNCH) in response to the input signal (IN) when activated by the clock signal (CLK). The synchronized signal (SYNCH) has a known timing relationship (phase delay) with the clock signal (CLK).

In an alternative embodiment, a single flip-flop circuit may be used to produce a synchronized signal that has a known timing relationship with the clock signal (CLK). However, with only one flip-flop circuit, there is a percentage chance that the arrival of the pulses for the input signal (IN) and the clock signal (CLK) will fail the setup and hold requirements of the single flip-flop circuit. A high logic level of the input signal (IN) and a high logic level of the clock signal (CLK) may arrive at the same time resulting in meta-stability. Meta-stability refers to the single flip-flop circuit registering some mid-rail voltage in response to a high logic level for the input signal (IN) rather than registering the high logic level. Using additional flip-flop circuits reduces the percentage chance that meta-stability will occur. The synchronizer circuit 210 shown in FIG. 2, uses two flip-flop circuits (212 and 214) to reduce meta-stability, however it may be appreciated that a greater or fewer number of flip-flop circuits may be used.

Flip-flop circuit 222 and logic gate 224 of one-shot generator 220 are arranged to produce a pulse signal (EVAL) in response to the synchronized signal (SYNCH) when activated by the clock signal (CLK). As previously stated, the period of the pulse signal (EVAL), or pulse period, corresponds to a number (e.g., "M") of cycles of the clock signal (i.e., clock cycles).

In this embodiment, pipe delay selector 230 is arranged to either add or remove a delay corresponding to a single clock cycle. When the select signal (SEL) is a "1", the period of output signal (OUT), or output period, corresponds to the output of flip-flop circuit 232. Accordingly, a one clock cycle delay between the pulse signal (EVAL) and the output signal (OUT) is caused by flip-flop circuit 232.

Alternatively, when the select signal (SEL) is a "0", the output period corresponds to the output of flip-flop circuit 234. Accordingly, a two clock cycle delay between the pulse signal (EVAL) and the output signal (OUT) is caused by both flip-flop circuit 232 and flip-flop circuit 234. Shifting between the one or two cycle delay in pipe delay selector 230 allows a single cycle delay to be added or remove between the pulse signal (EVAL) and the output signal (OUT) depending on the select signal (SEL). The value of the select signal (SEL) is determined by the 3-bit counter circuit 240, subtractor circuit 250, and state machine 260.

3-bit counter circuit 240 is reset for each pulse of the pulse signal (EVAL). 3-bit counter circuit 240 is a free-running counter that continuously counts from 0–7 unless reset by the pulse signal (EVAL). Accordingly, 3-bit counter circuit 140 measures a "period modulus 8" of the pulse signal (EVAL) and produces a 3-bit modulus 8 signal (MOD8). The 3-bit modulus 8 signal (MOD8) corresponds to the value of 3-bit counter circuit 240 just prior to being reset by pulse signal (EVAL). The 3-bit modulus 8 signal (MOD8) is used for comparison of the period of the pulse signal (EVAL) to an expected period. Since a difference between the periods of each cycle is discoverable from the period modulus 8 (MOD8), the full period need not be measured for slight differences between each cycle. However, in alternative embodiments, other counter circuits may be used to produce other modulus signals, including measuring the full period of each cycle of the pulse signal (EVAL) for comparison.

Subtractor circuit 250 measures the difference between the 3-bit modulus 8 signal (MOD8) and a 3-bit count state signal (COUNTst) (e.g., DIFF=MOD8−COUNTst). The 3-bit count state signal (COUNTst) corresponds to a period modulus 8 for the expected period. The comparison of the 3-bit modulus 8 signal (MOD8) and the 3-bit count state signal (COUNTst) produces a 3-bit difference signal (DIFF) that is propagated to the state logic circuit 262.

State logic circuit 262, parallel flip-flop circuit 264, and flip-flop circuit 266 of state machine 260 operate to produce the select signal (SEL). On each cycle of the clock signal (CLK), parallel flip-flop circuit 264 registers the 3-bit value of NXTCOUNTst as COUNTst. Similarly, flip-flop circuit 266 registers the value of NXTSIGNst as SIGNst. The operation of state logic circuit 262 is described in greater detail according to the table shown in FIG. 3 and described below. The select signal (SEL) is produced having a value of "1" or "0", causing a one clock cycle delay or two clock cycle delay respectively between the pulse signal (EVAL) and the output signal (OUT).

FIG. 3 illustrates a table (300) describing an exemplary logical operation of state logic circuit 262 shown in FIG. 2. EVAL, DIFF, SIGNst, COUNTst, NXTCOUNTst, and NXTSIGNst correspond to the signals as shown in FIG. 2, and diff corresponds to the difference in the modulus 8 the period of the input signal (IN) and the modulus 8 of the expected period.

SIGNst and COUNTst correspond to the values of the select signal (SEL) and NXTCOUNTst for a previous cycle of the input signal (IN) respectively. NXTCOUNTst and NXTSIGNst correspond to the next count state and the next sign state resulting from the current cycle of the input signal (IN).

The 3-bit difference signal (DIFF) is interpreted by state logic circuit 262 according to its "2's compliment". A 3-bit signal provides 8 possible values. In 2's compliment, the 8 possible values are 0, +1, −1, +2, −2, +3, −3, and −4 (denoted as ±4). Accordingly, a 3-bit binary value of "001" is interpreted as a +1, whereas a 3-bit binary value of "111" is interpreted as a −1.

When the pulse signal (EVAL) is "0", the period modulus of the current pulse period has not been determined. Accordingly, the NXTCOUNTst and NXTSIGNst retain values according to the previous cycle of the input signal (IN) of COUNTst and SIGNst respectively.

When the pulse signal (EVAL) transitions to a "1", the period modulus of the current pulse period is determined. 3-bit counter circuit 240 is reset and the difference signal (DIFF) is generated according to the difference between the counter value (modulus 8) just before 3-bit counter circuit 240 was reset and the value of COUNTst. Accordingly, values of NXTCOUNTst and NXTSIGNst may be determined according to table 300 from the values of DIFF and SIGNst.

The invention as shown in FIG. 2, compensates for a difference of +1 or −1 clock cycles between consecutive pulse periods. In one example, state logic circuit 262 expects the next pulse period to correspond to 100 clock cycles. Instead, the next pulse period corresponds to 99 clock cycles. Jitter cancellation circuit 200 adjusts the output period to maintain the 100 clock cycle period.

However, when the difference is sufficient (i.e., "sufficient difference") to prevent the jitter cancellation circuit 200 from correcting the jitter, jitter cancellation circuit 200 readjusts the expected period according to difference. In the implementation of FIG. 2, a sufficient difference exists for certain situations when the difference is +1 or −1 clock cycles (described below), and when the difference is greater than +1 or −1 clock cycles, such as +2 or −2 clock cycles. In one example, state logic circuit 262 expects the next pulse period to correspond to 100 clock cycles. Instead, the next pulse period corresponds to 102 clock cycles. Jitter cancellation circuit 200 adjusts the expected period of the output signal (OUT) to 101 clock cycles, determining that the period of the input signal (IN) has shifted.

Evaluating the logic according to table 300, when DIFF=000, the pulse period matches the expected period according to state logic circuit 262. Accordingly, the values of NXTCOUNTst and NXTSIGNst hold state, corresponding to the values COUNTst and SIGNst respectively.

When DIFF=001, and SIGNst=0, the pulse period is one clock cycle longer than the expected period. SIGNst is set to a "1" to compensate. Select signal (SEL) is a "1" when SIGNst is a "1". As previously described, pipe delay selector transitions from a two clock cycle delay to a one clock cycle delay when the select signal transitions from a "0" to a "1". The removal of a one cycle delay in pipe delay selector 230 offsets the additional one cycle delay caused by jitter. Accordingly, the output period is constant.

When DIFF=001, and SIGNst=1, the next pulse period is again one clock cycle longer than the expected period. However, since the select signal (SEL) is already a "1", pipe delay selector 230 is unable to offset the one cycle delay caused by the jitter. Pipe delay selector 230 is already set for a minimum delay. Instead, NXTCOUNTst is shifted to COUNTst+1, such that the expected period is increased by one clock cycle and NXTSIGNst≈SIGNst.

When DIFF=111, and SIGNst=0, the pulse period is one clock cycle shorter than the expected period. However, since the select signal (SEL) is a "0", pipe delay selector 230 is unable to increase the delay on the output signal (OUT) to compensate. Pipe delay selector 230 is already set for a maximum delay. Instead, NXTCOUNTst is shifted to COUNTst−1, such that the expected period is decreased by one clock cycle and NXTSIGNst≈SIGNst.

When DIFF=111, and SIGNst=1, the pulse period is again one clock cycle shorter than the expected period. SIGNst is set to a "0" to compensate. Select signal (SEL) is a "1" when SIGNst is a "1". As previously described, pipe delay selector 230 transitions from a one clock cycle delay to a two clock cycle delay when the select signal transitions from a "1" to a "0". The addition of a one cycle delay in pipe delay selector 230 offsets the jitter. Accordingly, the output period is constant.

When DIFF=010 or 110, the pulse period is two clock cycles shorter or longer than the expected period. In both situations, pipe delay selector 230 is unable to compensate for the difference. Instead, NXTCOUNTst is shifted to COUNTst+1 or COUNTst−1, to adjust the expected period towards the pulse period. Adjusting the expected period by a single clock signal when the pulse period varies by +2 or −2 clock cycles anticipates that the pulse period may varying by 2 clock signals an still be valid. For example, the period may fluctuate from 100 clock cycles to 102 clock cycles back to 100 clock cycles and so on. The expected period is set to 101 clock cycles and the output period is maintained at 101 clock cycles.

When DIFF=011, 100, or 101, the pulse period is three or more clock cycles shorter or longer than the expected period. Again, in these situations, pipe delay selector 230 is unable to compensate for the difference. Instead, NXTCOUNTst is shifted to COUNTst+diff to adjust the expected period to the pulse period. Alternatively, NXTCOUNTst may be set to the 3-bit value at the output of 3-bit counter circuit 240 (e.g., MOD8).

FIGS. 4A–4F show a timing diagram (400) of exemplary signals associated with the jitter cancellation circuit of FIG. 2. Timing diagram 400 includes an exemplary input signal (IN), output signal (OUT), count state (COUNTst), and sign state (SIGNst). In addition to the signals of FIG. 2, timing diagram 400 also includes an exemplary illustration of the period of the input signal (PERIODin) and the period of the output signal (PERIODout).

A single pulse, one clock cycle in width, occurs on the output signal (OUT) for each high logic level of the input signal (IN). As shown, the period of the output signal (PERIODout) remains substantially constant despite fluctuations in the period of the input signal (PERIODin). The only instance when the period of the output signal (PERIODout) substantially changes according to timing diagram 400, corresponds to a transition of value of the count state (COUNTst). Accordingly, jitter cancellation circuit 200 is able to cancel small fluctuations in the period of the input signal (PERIODin) that may result in jitter.

Although not shown, other counter circuits and pipe delay selectors may be employed to provided a greater range of compensation for period differences between each cycle of the input signal. For example, in light of the disclosure above, an N-bit counter circuit could be expanded to measure a greater or lesser modulus of the input signal (IN) (e.g., modulus 5 or modulus 64). Furthermore, a pipe delay selector may be included to remove or add delay to the output signal (OUT) corresponding to multiple cycles of the clock signal (CLK) (e.g., add 5 clock cycles delay or remove 10 clock cycles of delay).

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for canceling jitter from an input signal to produce an output signal with a substantially constant period, comprising:
   a pipe delay selector that is arranged to produce the output signal, wherein the period of the output signal is related to the period of the input signal; and
   a state machine that is arranged to produce a select signal in response to a comparison of a first state to a second state, wherein the first state corresponds to the period of the input signal and the second state corresponds to an expected period of the input signal such that the select signal enables the pipe delay selector to adjust a pipe delay between the input signal and the output signal according to a predetermined number of cycles of a clock signal.

2. The apparatus of claim 1, farther comprising a synchronizer circuit that is arranged to produce a synchronized signal that corresponds to the input signal, wherein the synchronized signal has a known timing relationship with the clock signal.

3. The apparatus of claim 2, further comprising a one-shot circuit that is coupled to the synchronizer circuit and is arranged to produce a pulse signal according to a rising edge of the input signal.

4. The apparatus of claim 1, further comprising a counter circuit that is arranged to produce a modulus signal, wherein the modulus signal has a value that is related to the period of the input signal.

5. The apparatus of claim 4, further comprising a subtract circuit that is arranged to determine the difference between the modulus signal and another signal corresponding to the expected period for the input signal.

6. The apparatus of claim 1, wherein an intended period for the output signal is adjusted to match a new period associated with the input signal when a determination is made that a sufficient difference exists between the new period of the input signal and the intended period.

7. The apparatus of claim 1, wherein an intended period for the output signal is adjusted towards a new period associated with the input signal when a determination is made that a sufficient difference exists between the new period of the input signal and the intended period.

8. The apparatus of claim 1, wherein the pipe delay selector adjusts the pipe delay in response to the comparison.

9. The apparatus of claim 1, wherein the comparison in the state machine further comprises evaluating a difference between a first modulus signal and a second modulus signal.

10. The apparatus of claim 9, wherein the first modulus signal corresponds to the period of a pulse signal and the second modulus signal corresponds to an expected period of the pulse signal, wherein the pulse signal is related to the input signal.

11. The apparatus of claim 9, wherein the difference between the first modulus signal and the second modulus signal determines a level of adjustment of the pipe delay such that the output signal maintains a substantially constant period.

12. An apparatus for canceling jitter from an input signal to produce an output signal with a substantially constant period, comprising:
   a synchronizer circuit that is arranged to produce a synchronized signal in response to the input signal when activated by a clock signal, such that the synchronized signal and clock signal are phase-aligned;
   a one-shot circuit that is coupled to the synchronizer circuit and is arranged to produce an evaluation signal in response to the synchronized signal;
   a counter circuit that is arranged to produce a modulus signal, wherein the counter circuit is reset in response to the evaluation signal such that the modulus signal has an associated first value prior to a first reset that corresponds to the period of the input signal;
   a subtract circuit that is arranged to produce a difference signal according to a comparison of a first value of a modulus signal to a second value that corresponds to an expected period for the input signal;
   a pipe delay selector that is arranged to produce the output signal in response to a select signal, wherein a period associated with the output signal is determined by a period associated with the input signal; and
   a state machine that is arranged to produce the select signal in response to the difference signal, wherein the select signal enables the pipe delay selector to adjust a pipe delay between the input signal and the output signal according to a predetermined number of cycles of the clock signal.

13. The apparatus of claim 12, wherein an intended period for the output signal is adjusted to match a new period associated with the input signal when a determination is made that a sufficient difference exists between the new period of the input signal and the intended period.

14. A method for canceling jitter from an input signal to produce an output signal with a substantially constant period, comprising:
   producing a synchronized signal in response to the input signal when activated by a clock signal, wherein the synchronized signal corresponds to an evaluation signal such that the evaluation signal and clock signal are phase-aligned;
   producing the output signal in response to the evaluation signal and a select signal, wherein a period associated with the output signal is determined by a period associated with the input signal; and
   producing the select signal in response to a comparison of a first value corresponding to the period of the input signal and a second value that corresponds to an expected period of the input signal such that the select signal enables adjustment of a pipe delay according to a predetermined number of cycles of the clock signal such that the period of the output signal remains substantially constant.

15. The method of claim 14, further comprising producing a modulus signal, wherein the modulus signal has a value that relates to the period of the synchronized signal.

16. The method of claim 15, further comprising determining the difference between the values of the modulus signal.

17. The method of claim 14, wherein the comparison of the first value and the second value further comprises evaluating a difference between a modulus signal of the period of the synchronized signal and a modulus signal of an expected period of the synchronized signal.

18. The method of claim 14, wherein an intended period for the output signal is adjusted to match a new period associated with the input signal when a determination is made that a sufficient difference exists between the new period of the input signal and the intended period.

19. The method of claim 18, further comprising producing a difference signal that corresponds to the difference between the new period associated with the input signal and the intended period.

* * * * *

UNITED STATES PATENT AND TRADEMARK OFFICE
CERTIFICATE OF CORRECTION

| | | |
|---|---|---|
| PATENT NO. | : 7,133,483 B1 | Page 1 of 1 |
| APPLICATION NO. | : 10/255166 | |
| DATED | : November 7, 2006 | |
| INVENTOR(S) | : Paul Joseph Kramer et al. | |

It is certified that error appears in the above-identified patent and that said Letters Patent is hereby corrected as shown below:

Column 2, Line 28: "a timing diagrams" should read -- a timing diagram --

Column 10, Line 28: "according to a comparison of a first value of a" should read -- according to the comparison of the first value of the --

Signed and Sealed this

Thirteenth Day of March, 2007

JON W. DUDAS
*Director of the United States Patent and Trademark Office*